United States Patent [19]

Morrison, Jr.

[11] 4,303,489
[45] Dec. 1, 1981

[54] METHOD AND APPARATUS FOR PRODUCING A VARIABLE INTENSITY PATTERN OF SPUTTERING MATERIAL ON A SUBSTRATE

[75] Inventor: Charles F. Morrison, Jr., Boulder, Colo.

[73] Assignee: Vac-Tec Systems, Inc., Boulder, Colo.

[21] Appl. No.: 935,359

[22] Filed: Aug. 21, 1978

[51] Int. Cl.³ .............................................. C23C 15/00
[52] U.S. Cl. ............................... 204/192 R; 204/298; 427/282
[58] Field of Search ........................... 204/192 R, 298; 427/282

[56] References Cited

U.S. PATENT DOCUMENTS

| | | | |
|---|---|---|---|
| 3,170,810 | 2/1965 | Kagan | 427/47 |
| 3,335,030 | 8/1967 | Vercesi | 427/282 |
| 3,561,993 | 2/1971 | Geffcken | 427/282 |
| 3,573,960 | 4/1971 | Duncan | 427/282 |
| 3,664,948 | 5/1972 | Graffeo, Jr. et al. | 204/298 |
| 3,775,285 | 11/1973 | Lane | 204/298 |
| 3,904,503 | 9/1975 | Hanfmann | 204/192 |
| 3,933,644 | 1/1976 | Skinner et al. | 204/298 |
| 4,013,502 | 3/1977 | Staples | 156/608 |
| 4,102,768 | 7/1978 | Kearin et al. | 204/192 P |

Primary Examiner—Delbert E. Gantz
Assistant Examiner—William Leader
Attorney, Agent, or Firm—Gerald J. Ferguson, Jr.; Joseph J. Baker

[57] ABSTRACT

Method and apparatus for producing a variable intensity pattern of sputtering material on a substrate by providing a mask having a patterned opening therein between the cathode of a sputtering device and the substrate to be coated, the mask being so positioned as (a) to not affect the plasma over the cathode surface and (b) to be out of contact with the substrate surface, there being relative movement between at least the cathode and the substrate. The substrate may be either flat, curved or tubular, for example, there also being described apparatus and a method of making a broad band, dipole antenna.

28 Claims, 7 Drawing Figures

METHOD AND APPARATUS FOR PRODUCING A VARIABLE INTENSITY PATTERN OF SPUTTERING MATERIAL ON A SUBSTRATE

BACKGROUND OF THE INVENTION

1. Field of the Invention

This invention relates to a method and apparatus for producing a variable intensity pattern of sputtering material on a substrate.

2. Discussion of the Prior Art

Typical pattern sputtering is done with a mask which is in contact with and tightly fits onto the substrate to give sharp detail. Illustrative of such pattern work is the formation of electrical components and connections on integrated circuit substrates.

It is also known in the prior art to provide masks adjacent to the cathode of a sputtering device to modify the plasma formed adjacent the cathode and thereby affect the size of the cathode portion which is eroded. However, by interfering with the plasma, the efficiency of such devices is substantially reduced.

SUMMARY OF THE INVENTION

The present invention corresponds to the prior art in that a mask is employed in a sputtering device. However, it differs from the prior art devices in that the mask is so positioned that (a) it is out of contact with the substrate yet (b) it is sufficiently removed from the cathode that it does not substantially affect the plasma adjacent the cathode. By providing relative movement at least between the cathode and the substrate, a variable intensity pattern of sputtering material is formed on the substrate in accordance with the primary object of this invention.

It is a further important object of this invention to provide an improved method and apparatus for making a broad band antenna or the like employing the above described method and apparatus for producing a variable intensity pattern of sputtering material on a substrate.

Other objects and advantages of this invention will be apparent from a reading of the following specification and claims taken with the drawing.

DETAILED DESCRIPTION OF PREFERRED EMBODIMENTS OF THE INVENTION

Figure 1:
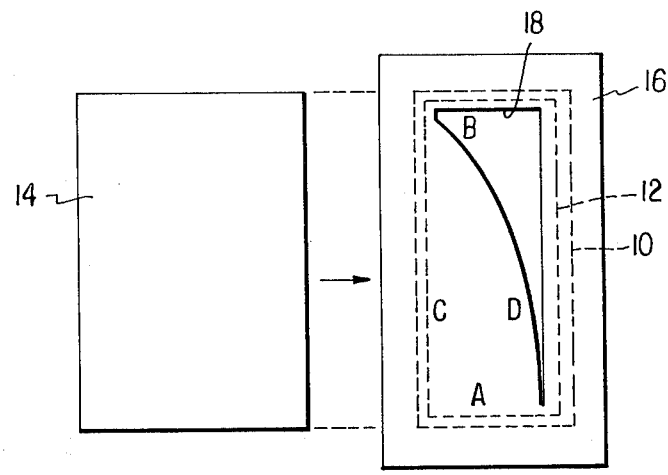
FIG. 1 is a schematic, plan view of an illustrative embodiment of a sputtering apparatus in accordance with the present invention.

Reference should be made to the drawing where like numerals refer to like parts.

Figure 2:
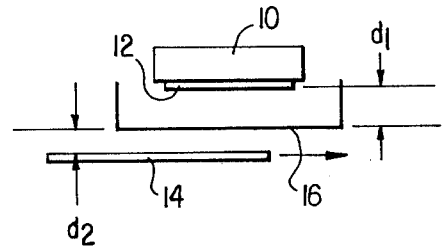
FIG. 2 is a side elevation view of the embodiment of FIG. 1.

Referring to FIG. 1 there is shown a plan view of an illustrative embodiment of a sputtering apparatus in accordance with the invention including a cathode 10 having a layer of target material 12 disposed thereon. Alternatively, cathode 10 and target layer 12 may comprise the same layer. A substrate 14 to be coated with the sputtered target material is shown in FIGS. 1 and 2 moving in the direction of the arrow whereby the substrate will be coated as it passes by the cathode. In order to provide a variable intensity coating on the substrate, a mask 16 is disposed between the cathode and substrate, the mask having an opening 18 provided therein. The mask is so positioned that the distance $d_1$ (FIG. 2) is such that the mask has little, if any, effect on the plasma formed adjacent cathode 10. As is well known in this art, such plasmas arise because of a potential difference established between the cathode and an anode included in the sputtering apparatus. The mask 16 may be the anode. Further, the walls of the sputtering device may be the anode or a separate anode structure may be employed. The plasma is instrumental in implementing the sputtering of the target material. Thus, by making the distance $d_1$ such that the mask does not affect the plasma, there is no undesired effect on the operating efficiency of the sputtering device. Although the distance the mask should be spaced from the cathode varies with such factors as cathode size, in typical applications the mask should be at least one inch from the cathode while with smaller cathodes, the spacing can sometimes be decreased to $\frac{3}{4}$ inch.

Further, the distance $d_2$ should be such that the mask 16 is at least out of contact with substrate 14. By selecting $d_1$ and $d_2$ in the foregoing manner, a variable intensity pattern of the sputtering material is formed on the substrate, the pattern depending upon the shape of opening 18. Thus, with the patterned opening 18 of FIG. 1, the thickness of the coating on substrate 16 will linearly vary from A to B, the coating thickness being negligibly thick at A and thickest at B. Such unevenness or non-uniformity of coating thickness has been avoided heretofore. However, the object of the present invention, as stated hereinbefore is to provide a method and apparatus for intentionally generating unevenness of coating thickness—that is, a variable intensity pattern of sputtered material.

A flat pattern is generated with the structure of FIGS. 1 and 2 with intensity variability in one axis only, there being no intensity variation along the axis extending from C to D. Further, relative motion between the cathode and substrate is effected in this embodiment by moving the substrate with respect to the mask and the cathode. However, various relative movements can be employed to effect desired patterns of coating thickness. Thus, for example, any or all of the following relative movements are contemplated: (a) substrate linear motion past a fixed mask and cathode as in FIG. 1; (b) substrate and mask linear motion past fixed cathode; (c) substrate linear motion and independent mask motion such as up and down motion with respect to substrate, both the substrate and the mask moving linearly past a fixed cathode; (d) moveable cathode past fixed substrate and mask (moveable cathode embodiments are usually most convenient only when coating very large substrates); (e) moveable cathode and mask past fixed substrate; (f) moveable cathode and separately moveable mask past fixed substrate; (g) substrate, mask and cathode each independently moveable; (h) rotational equivalence of all of the above where a rotational equivalent of the FIG. 1 embodiment will be described hereinafter with respect to FIGS. 3 and 4; (i) programmed equivalents of all of the above where all shapes and types of motion are implemented; and (j) time and/or position shaped mask(s) employed in all of the above to effect shape variability.

Figure 3:
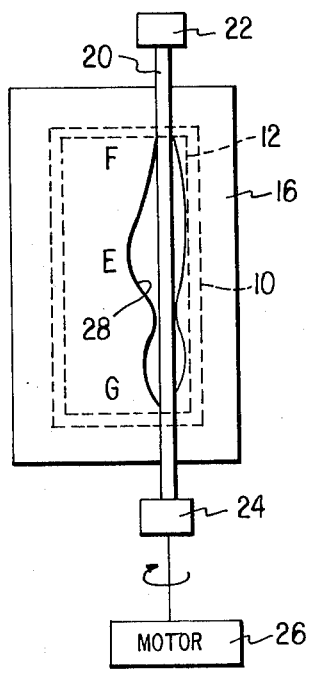
FIG. 3 is a schematic, plan view of a further illustrative embodiment of the invention.
Figure 4:
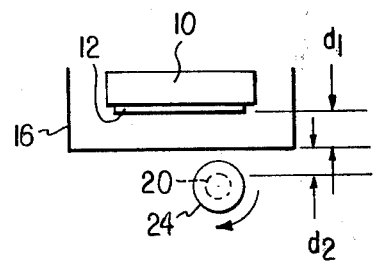
FIG. 4 is a side elevation view of the embodiment of FIG. 3.

Referring to FIGS. 3 and 4, there is shown an illustrative embodiment for effecting a tubular variable intensity pattern of sputtering material where a tubular substrate 20 is supported between chucks 22 and 24 and rotated by a motor 26 under opening 28. Opening 28 is of an arbitrary shape which will provide a variation in coating thickness along the axis of the tubular substrate, the coating being thickest at E and thinnest at end points F and G.

Figure 5:
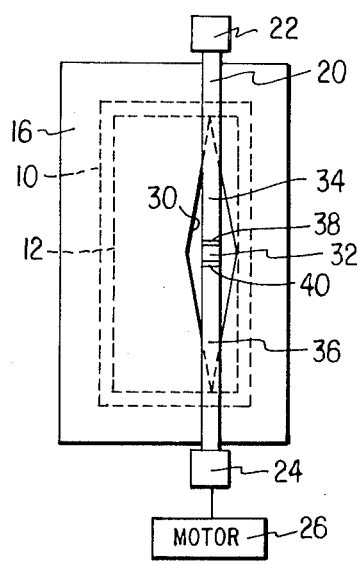
FIG. 5 is a schematic, plan view of an illustrative embodiment of the invention for manufacturing a dipole antenna.

The patterned opening 28 of the embodiment of FIGS. 3 and 4 may be modified to that shown at 30 in FIG. 5 whereby a broad band, dipole antenna may be constructed in accordance with the principles of this invention where all of the materials, dimensions, etc. given in the following example are meant to be illustrative only. Thus, such an antenna may be manufactured by providing a tight mask or band 32 (a copper wire or the like) having a width of 0.025 inches around the circumference of tubular substrate 20 at the center thereof, the substrate 20 being about $7\frac{1}{2}$ cm long. Thus, mask 32 would correspond to such masks as they have been employed in the prior art. Next, in accordance with the present invention, a linear conductivity taper of typically 22 ohms per 5 mm at the center to 250 ohms per 5 mm at the ends is coated on tube 20 at monopole portions 34 and 36, each of these portions typically extending $3\frac{1}{2}$ cm from the center to each end. Next, 50,000 Å gold connector bands 38 and 40 are sputtered or evaporated on each side of center mask 32, the bands each being 3 mm wide. The substrate 20 comprises an electrically non-conductive material such as glass, the monopoles 34 and 36 being resistive material such as Inconel and the connector bands 38 and 40 being gold.

When the tight center mask 32 is removed, a dipole antenna results having essentially no reflected power of any significance at any frequency above a few KHz. The antenna itself is a known device; however, heretofore it has not been possible to easily mass produce such antennas. As can be appreciated, such antennas are very advantageous due to the broad band characteristics thereof. These characteristics are effected by the variable intensity pattern of resistive material sputtered at monopole portions 34 and 36. Thus, towards the center of the dipole, the conductivity is quite high while at the respective ends thereof, the conductivity is quite low. Hence, the power is effectively absorbed at the ends of the dipole thereby permitting little, if any, power to be reflected back to input lines connected to bands 38 and 40.

Figure 6:
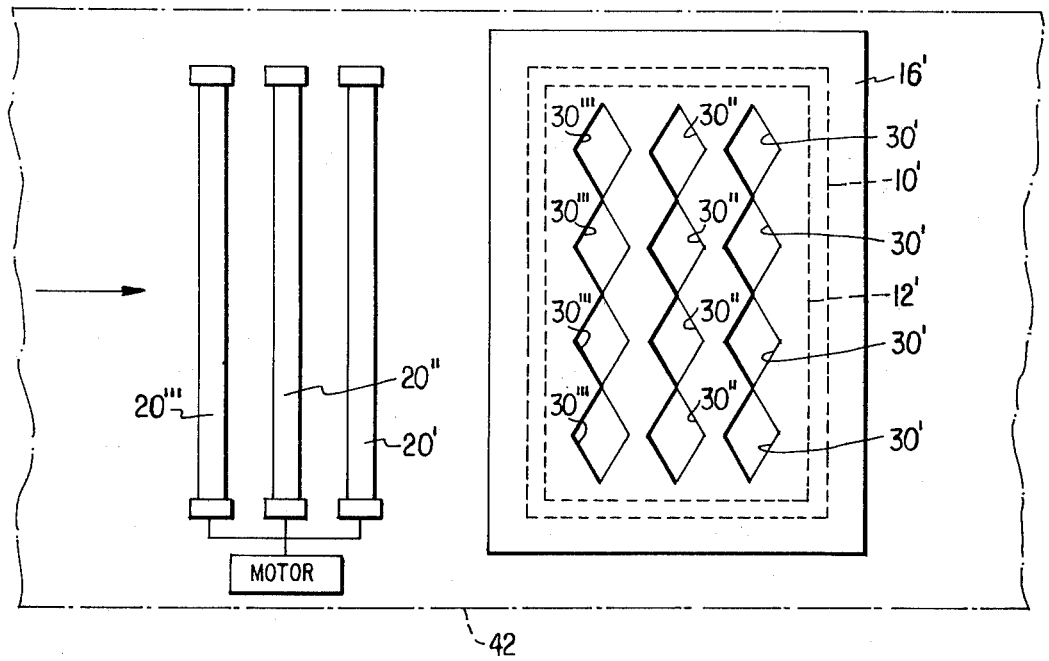
FIG. 6 is a schematic, plan view of illustrative apparatus for mass producing devices where the mask is held stationary with the cathode.
Figure 7:
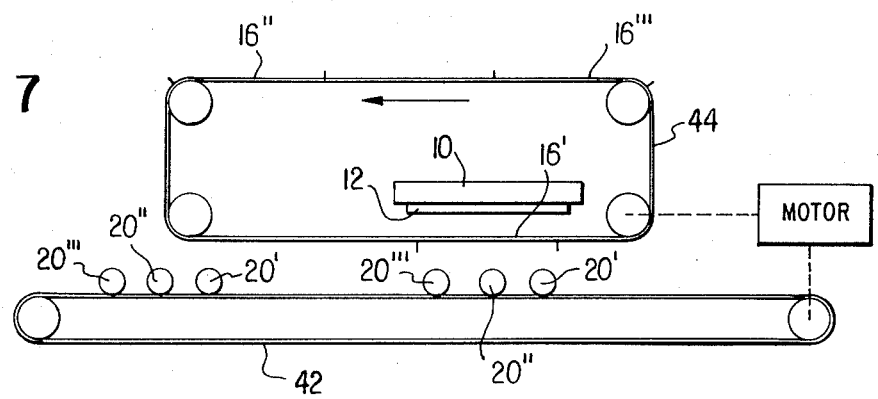
FIG. 7 is a schematic, side elevation view of illustrative apparatus for mass producing devices where the mask moves with respect to the cathode.

Reference should be made to FIGS. 6 and 7 where mass production of the dipoles or other devices is illustrated, it being expected that 1,000 or more of the dipoles can be produced per hour with one 5×15 inches cathode on a continuous flow basis. In the embodiment of FIG. 6, the mask 16 has a plurality of patterned openings 30', 30" and 30''', each corresponding to the opening 30 of FIG. 5 where the mask is stationary as is cathode 10. The openings 30', 30" and 30''' are arranged in three columns which substantially cover the target surface 12. A belt 42 indicated by phantom lines supports tubular substrates 20', 20" and 20''' and a motor 26' which rotates the tubular substrates. The substrates are conveyed by belt 42 to a position underneath the cathode where the belt is halted so that substrates 20', 20" and 20''' are respectively aligned with columns 30', 30" and 30''' of the patterned openings. As the motor 26' rotates the substrates, four dipole antennas are formed on each substrate or altogether twelve antennas are formed in a single operation. The belt 42 typically may support a number of substrates so that as soon as the twelve antennas are produced, a next group of substrates is moved beneath the cathode where typically forty seconds are required for the formation of each batch of antennas. Although the columns 30', 30" and 30''' have each been shown as including four patterned openings, there may be any number of such openings in each column such as two, six or seven. Also the number of columns may vary where there may be 16 (8 columns with two openings in each column) to 40 (20 columns with two openings in each column) openings per mask, for example. Further, due to the variation of the deposition pattern, the size of the openings in columns 30' and 30''' would typically be somewhat larger than those in column 30". Also the size of the openings in the top half of the mask may vary somewhat with respect to those in the bottom.

As the target erodes, its deposition pattern will also change slightly with respect to time. For shorter production runs, this may preferably be accommodated by appropriate means (not shown) where the size of the patterned openings may be individually adjusted. For longer production runs, the entire mask 16' may be replaced with another mask, the openings of which take into account the changed deposition pattern.

In the embodiment of FIG. 7, the operation is different from the intermittent operation of the FIG. 6 embodiment in that the masks 16' are moved with respect to stationary cathode 10. Thus, as each group of substrates 20', 20" and 20''' moves under cathode 10, masks 16', 16" and 16''' move in synchronism with the substrates where, once again, the substrates 20', 20" and 20''' are respectively disposed beneath columns 30', 30" and 30''' of patterned openings. To accommodate a close spacing of the substrate groups along belt 42, there is provided along an endless belt 44, a plurality of masks 16', 16" and 16''' where each of the masks 16', 16" and 16''' are identical so that as each group of substrates passes under the cathode, one of the masks will be in alignment therewith. As noted above with respect to the FIG. 6 embodiment, the openings of columns 30' and 30''' may be larger than those of column 30". However, such is not the case with the openings in masks 16', 16" and 16'''. Rather, they are all identical since each opening passes the same amount of sputtered material as it traverses by cathode 10. As can be appreciated, the intermittent nature of the operation of the FIG. 6 embodiment is avoided in the FIG. 7 embodiment in that the substrates move continuously under the cathode 10.

Although the present invention is particularly advantageous when employed with sputter devices of the magnetically enhanced type having a rectangular configuration such as shown in the drawing, it should be understood that it may also be employed with diode type sputtering cathodes which provide uniformity in two dimensions but well away from the target edges.

Further, it should be appreciated that not only tubular, broad band dipole antennas are readily produced by the method and apparatus of the present invention but also antennas of other configurations, such as flat or curved ones.

What is claimed is:

1. A method of producing a dipole antenna having two variable electrical conductivity elements, said method comprising the steps of activating a sputtering device having a cathode including electrical conductivity material to be sputtered on at least one substrate, a plasma being established adjacent said cathode whereby said electrical conductivity material is sputtered toward said substrate;

providing at least one mask having at least one patterned opening of fixed configuration therein between said cathode and said substrate so that (a) it is out of contact with the substrate and (b) it is no closer than about ¾ inch from the cathode;

providing a further mask in intimate contact with a portion of said substrate, said portion dividing the substrate into first and second areas where the two dipole elements are to be respectively deposited;

relatively moving at least said cathode and said substrate with respect to each other so that the electrical conductivity material passing through said patterned opening in the mask deposits on the substrate, the thickness of the deposited material varying across at least one dimension of said first and second areas of the substrate to thereby form said variable electrical conductivity elements of the antenna due to the fixed configuration of the patterned opening; and depositing electrically conductive connector bands at opposite sides of said further mask.

2. A method as in claim 1 where said relatively moving step includes fixing said mask and cathode in place and moving said substrate past the fixed mask and cathode.

3. A method as in claim 1 where said relatively moving step includes fixing said cathode in place and moving said mask and substrate past the fixed cathode.

4. A method as in claim 3 including moving said mask and substrate together.

5. A method as in claim 3 including moving said mask and substrate independently of one another.

6. A method as in claim 1 where said relatively moving step includes fixing said mask and substrate in place and moving said cathode past the fixed mask and substrate.

7. A method as in claim 1 where said relatively moving step includes fixing said substrate in place and moving said mask and cathode past the fixed substrate.

8. A method as in claim 7 including moving said mask and cathode together.

9. A method as in claim 7 including moving said mask and cathode independently of one another.

10. A method as in claim 1 where said relatively moving step includes independently moving both said cathode and substrate.

11. A method as in claim 10 including further independently moving said mask.

12. A method as in claim 1 including moving said cathode and substrate relatively linearly with respect to one another.

13. A method as in claim 12 including rotating said cathode and substrate relatively with respect to one another.

14. A method as in claim 1 where said relative moving step effects variable movement with respect to time and/or position.

15. A method as in claim 1 including establishing a magnetic field adjacent said cathode to magnetically enhance the sputtering thereof.

16. A method as in claim 15 where said cathode is generally rectangular in planar configuration.

17. A method as in claim 1 including a plurality of said masks and a plurality of substrates respectively associated with said masks.

18. A method as in claim 17 where a first half of said plurality of masks are disposed adjacent a first half of said cathode and a second half thereof are disposed adjacent the other half of the cathode.

19. A method as in claim 17 where said mask and said cathode are fixed with respect to one another and where the patterned openings in said plurality of masks vary in shape in the direction of relative movement of said cathode and substrate.

20. A method as in claims 18 or 19 where said substrates are tubular.

21. A method as in claim 20 including means for rotating the tubular substrates.

22. A method as in claim 19 including moving said masks with respect to said cathode including moving said masks and said substrates in synchronism as the substrates pass the cathode.

23. A method as in claim 1 where said mask is no closer than about 1 inch from the cathode.

24. A method as in claim 1 where said substrate is flat.

25. A method as in claim 1 where said substrate is non-planar.

26. A method as in claim 1 where said substrate is tubular.

27. A method as in claim 26 including rotating the tubular substrate.

28. A method as in claim 1 where the configuration of said patterned opening in said mask is such that the variation in thickness of said deposited material is substantially linear across at least a corresponding first dimension of said first and second areas.

* * * * *